(12) United States Patent
Yoo et al.

(10) Patent No.: US 12,424,435 B2
(45) Date of Patent: Sep. 23, 2025

(54) SUBSTRATE PROCESSING METHOD

(71) Applicant: ASM IP Holding B.V., Almere (NL)

(72) Inventors: TaeHee Yoo, Bucheon-si (KR);
SeWoong Jung, Hwaseong-si (KR);
JuHyuk Park, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 539 days.

(21) Appl. No.: 17/866,730

(22) Filed: Jul. 18, 2022

(65) Prior Publication Data
US 2023/0030566 A1  Feb. 2, 2023

Related U.S. Application Data

(60) Provisional application No. 63/224,120, filed on Jul. 21, 2021.

(51) Int. Cl.
*H01L 21/02* (2006.01)

(52) U.S. Cl.
CPC .. *H01L 21/02129* (2013.01); *H01L 21/02211* (2013.01); *H01L 21/0228* (2013.01)

(58) Field of Classification Search
None
See application file for complete search history.

(56) References Cited

U.S. PATENT DOCUMENTS

| | | | | |
|---|---|---|---|---|
| 6,110,814 A | * | 8/2000 | Tokumasu | ........ H01L 21/76819 257/E21.243 |
| 8,043,884 B1 | * | 10/2011 | Nieh | ................. H01L 21/02164 438/73 |
| 2019/0259625 A1 | | 8/2019 | Nemani | |

* cited by examiner

*Primary Examiner* — Asok K Sarkar
(74) *Attorney, Agent, or Firm* — Snell & Wilmer L.L.P.

(57) ABSTRACT

A substrate processing method of filling a recess without voids or seams includes least partially filling a trench with a first material on a substrate including the trench; and supplying at least one constituent element included in the first material and applying plasma to induce fluidization of the first material.

19 Claims, 8 Drawing Sheets

SUBSTRATE PROCESSING METHOD

CROSS-REFERENCE TO RELATED APPLICATIONS

This application claims priority to U.S. Provisional Patent Application Ser. No. 63/224,120 filed Jul. 21, 2021 and titled SUBSTRATE PROCESSING METHOD, the disclosure of which is hereby incorporated by reference in its entirety.

BACKGROUND

1. Field

One or more embodiments relate to a substrate processing method, and more particularly, to a method of filling a film in a recess area formed in a substrate, for example, a gap or trench structure.

2. Description of the Related Art

In general, a deposition-etching-deposition (DED) technique for filling a recess structure such as shallow trench isolation (STI) of a semiconductor device and a vertical gate structure of a 3D VNAND device is well known. In a deposition step for filling a recess area, a film is deposited using atomic layer deposition (ALD), plasma enhanced atomic layer deposition (PEALD), chemical vapor deposition (CVD), high-density plasma chemical vapor deposition (HDP CVD), or the like. In particular, a CVD method or a plasma chemical vapor deposition method is mainly used for rapid film formation.

A phosphosilicate glass (PSG) film, which is a glass material, is used as an insulating film for filling the STI and is mainly filled by CVD. In order to impart flowability to the PSG film, a subsequent heat treatment is required at a temperature higher than a melting point, for example, at a high temperature of 700° C. or higher. However, there are still voids in a filling film, and there is a problem in that a high-temperature process reduces a device performance by applying thermal shock to a semiconductor device. For example, high-temperature processing may cause an ion diffusion in a semiconductor device to destroy insulating properties.

SUMMARY

One or more embodiments include a substrate processing method of filling a recess area without thermal shock to a device by using a filling material at a temperature below a melting point of the filling material such as a phosphosilicate glass (PSG) film. In more detail, one or more embodiments include a substrate processing method of filling a recess without voids or seams by filling a recess structure with a filling material to have flowability and increasing the density of a film.

Additional aspects will be set forth in part in the description which follows and, in part, will be apparent from the description, or may be learned by practice of the presented embodiments of the disclosure.

According to one or more embodiments, the substrate processing method includes at least partially filling a trench with a first material on a substrate including the trench; and supplying at least one constituent element included in the first material and applying plasma to induce fluidization of the first material.

According to an example of the substrate processing method, the filling may be performed at a first temperature lower than a melting point of the first material.

According to another example of the substrate processing method, the inducing of fluidization may be performed at a second temperature lower than the melting point of the first material.

According to another example of the substrate processing method, the filling may be performed at the first temperature, and the inducing of fluidization is performed at the second temperature, wherein at least one of the first temperature and the second temperature may be lower than the melting point of the first material, and the second temperature may be higher than the first temperature.

According to another example of the substrate processing method, by the fluidization, the first material may be converted into a second material.

According to another example of the substrate processing method, flowability of the second material may be higher than flowability of the first material.

According to another example of the substrate processing method, the first material may have a linear molecular structure, and the second material may have a networked molecular structure.

According to another example of the substrate processing method, the first material may include oxygen elements, and an oxygen content of the second material may be greater than an oxygen content of the first material.

According to another example of the substrate processing method, between the filling and the inducing of fluidization, supplying an inert gas may be performed.

According to another example of the substrate processing method, active species of the inert gas may be generated during at least a portion of a time period of the supplying of an inert gas, and the active species may contribute to an increase in flowability of the first material.

According to another example of the substrate processing method, a gap-fill layer formed by the filling and the supplying of an inert gas may include a recess of a first depth, and the gap-fill layer may include a void.

According to another example of the substrate processing method, after the inducing of fluidization, the recess of the gap-fill layer may be changed to have a second depth greater than the first depth.

According to another example of the substrate processing method, the filling may include: supplying a silicon source; supplying a phosphorous source; and supplying plasma power.

According to another example of the substrate processing method, the silicon source may include BDEAS, and the phosphorus source may include TMPi.

According to another example of the substrate processing method, the inducing of fluidization may include: supplying an oxygen-containing gas; and supplying plasma power.

According to another example of the substrate processing method, the first material may include $Si_xP_2O_3$, and by the inducing of fluidization, $Si_xP_2O_3$ of a PSG gap-fill layer may be converted into $Si_xP_2O_5$.

According to another example of the substrate processing method, the filling and the inducing of fluidization may be performed in-situ in the same reactor.

According to another example of the substrate processing method, the substrate processing method may be performed in a substrate processing apparatus including at least one reactor, wherein the substrate processing apparatus may include a first reactor and a third reactor in which the filling is performed; a second reactor and a fourth reactor in which the inducing of fluidization is performed; and a substrate transfer unit configured to transfer a substrate from the first reactor to the second reactor and transfer a substrate from the third reactor to the fourth reactor.

According to one or more embodiments, a substrate processing method includes: forming a PSG film including $Si_xP_2O_3$ at least partially filling a trench on a substrate including the trench at a first temperature below a melting point of PSG; increasing flowability of the PSG film by applying argon active species onto the PSG film; and inducing reflow of the PSG film by applying oxygen active species onto the PSG film at a second temperature lower than the melting point of the PSG, wherein, by the inducing of reflow, $Si_xP_2O_3$ included in the PSG film may be converted into $Si_xP_2O_5$.

According to one or more embodiments, a substrate processing method includes: a first cycle including supplying a silicon source including BDEAS and purging the silicon source; a second cycle including supplying a phosphorous source including TMPi and purging the phosphorous source; a third cycle including supplying argon active species and purging residue including $C_2H_5OH$; a fourth cycle including supplying oxygen active species and purging the oxygen active species, wherein the first cycle to the fourth cycle may be performed at a temperature lower than a melting point of PSG.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described in detail with reference to the accompanying drawings.

In this regard, the present embodiments may have different forms and should not be construed as being limited to the descriptions set forth herein. Rather, these embodiments are provided so that the disclosure will be thorough and complete, and will fully convey the scope of the disclosure to one of ordinary skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any order, quantity, or importance, but rather are only used to distinguish one component, region, layer, and/or section from another component, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected because of, for example, manufacturing techniques and/or tolerances. Thus, the embodiments of the disclosure should not be construed as being limited to the particular shapes of regions illustrated herein but may include deviations in shapes that result, for example, from manufacturing processes.

Figure 4:
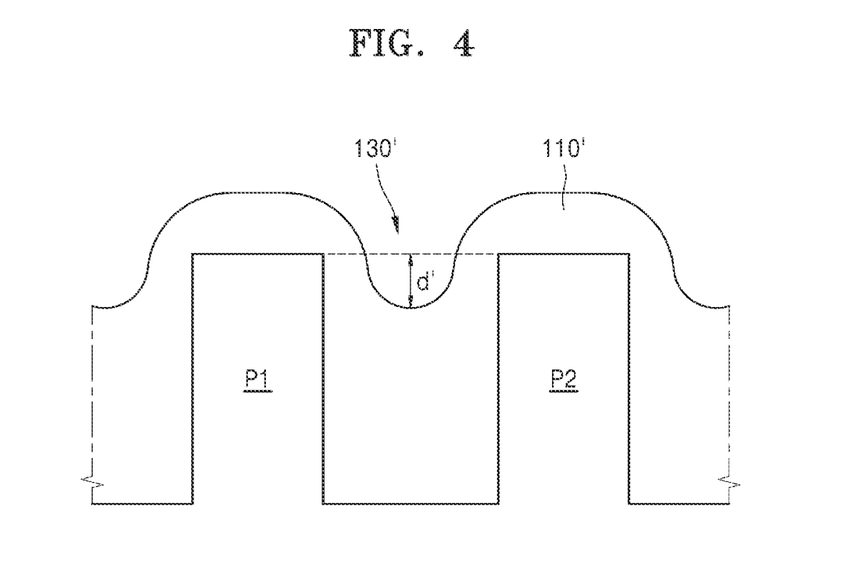
Figure 5:
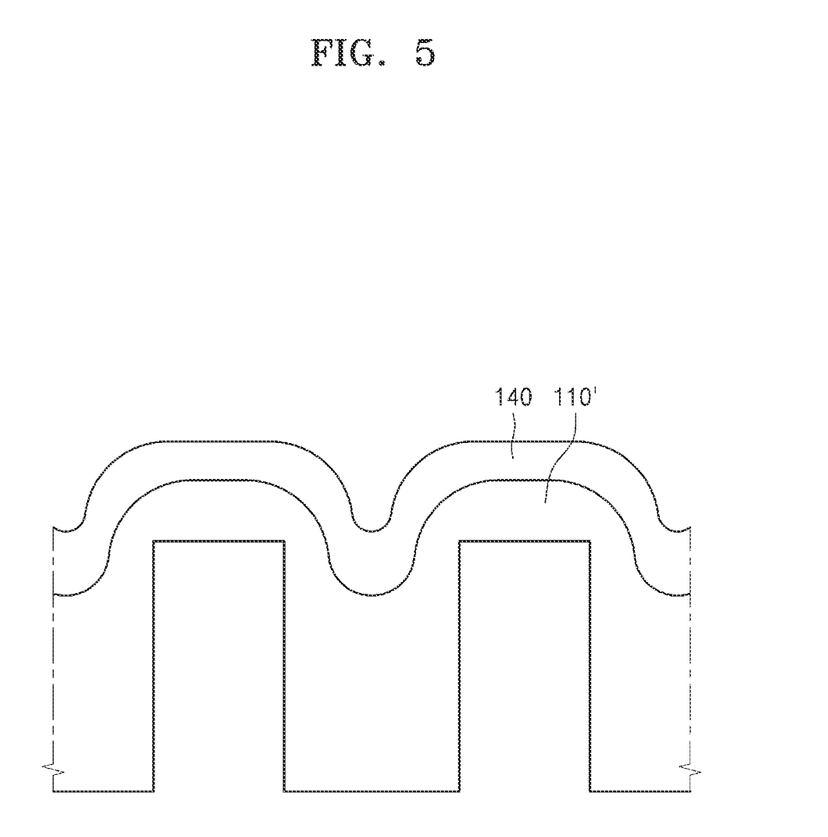
Figure 6:
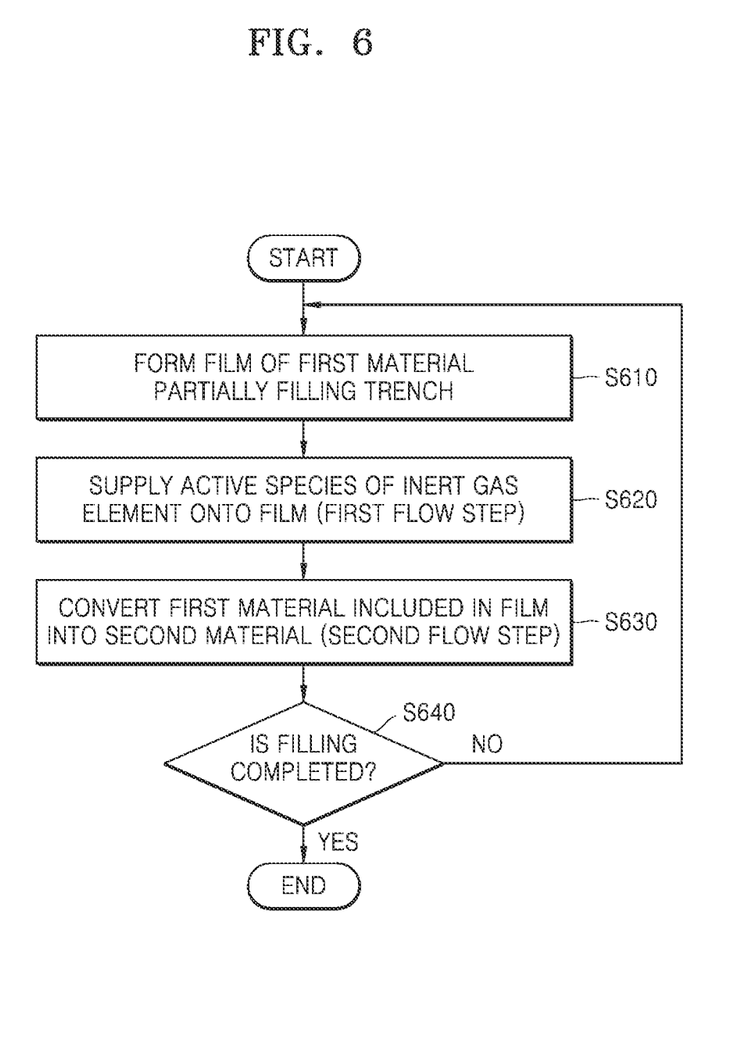
FIG. 6 is a flowchart illustrating the substrate processing method illustrated in FIGS. 1 to 5.

FIGS. 1 to 5 are views illustrating a substrate processing method according to embodiments. FIG. 6 is a flowchart illustrating the substrate processing method illustrated in FIGS. 1 to 5.

Figure 1:
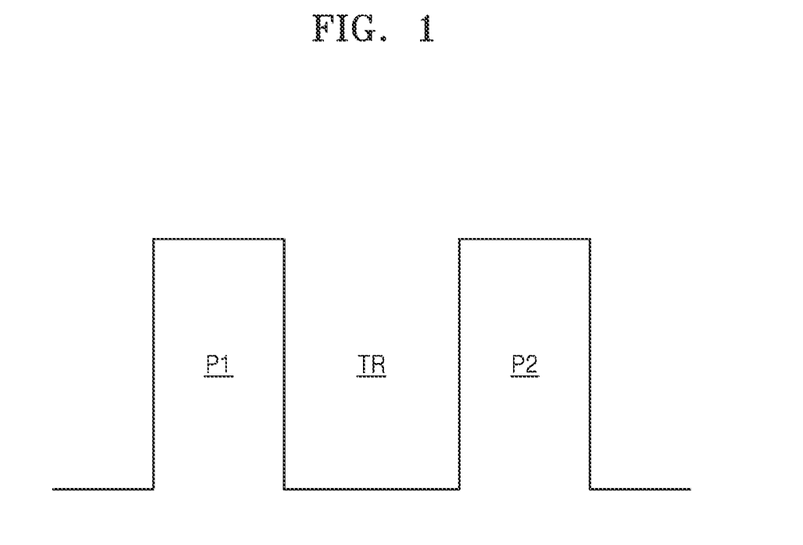
FIGS. 1 to 5 are views illustrating a substrate processing method according to embodiments.

Referring to FIG. 1, first, a pattern structure having a first protrusion P1 and a second protrusion P2 is provided. The pattern structure is a non-flat structure, and may include an upper surface, a lower surface, and a side surface connecting the upper surface to the lower surface. The pattern structure may be used to form an active area or may be used to form a gate pattern. For example, when the pattern structure is used to implement a flash memory, each of the first protrusion P1 and the second protrusion P2 may include a gate electrode and a tunneling insulating layer.

The pattern structure may be formed in a substrate, and the substrate may be, for example, a semiconductor substrate or a display substrate. The substrate may include, for example, any one of silicon, silicon-on-insulator, silicon-on-sapphire, germanium, silicon-germanium, and gallium-arsenide. It should be noted that although the pattern structure is implemented in a shape that protrudes upward in the drawings, the pattern structure may extend to protrude laterally.

By providing the pattern structure, a trench TR may be formed between the first protrusion P1 and the second protrusion P2. In a case where the pattern structure is used to form an active area, a device isolation area of the semiconductor substrate may be defined by the trench TR, and an active area of the semiconductor substrate may be defined by the device isolation area.

Figure 2:
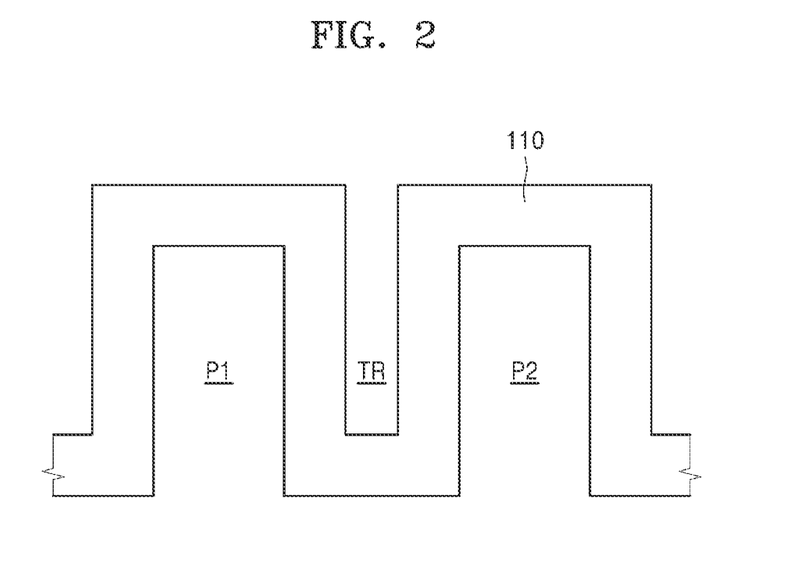

Thereafter, referring to FIGS. 2 and 6, operation S610 of forming a film 110 of a first material partially filling the trench TR is performed. The first material used to at least partially fill the trench TR may include, for example, silicate glass. In some examples, the first material may include phosphorous silicate glass (PSG). In another example, the first material may include at least one of $SiO_2$, hydrogen silsesquioxane (HSQ), methyl silsesquioxane (MSQ), amorphous fluorocarbon (a-C: F), fluorinated silicon oxide (SiOF), and silicon oxycarbide (SiOC).

The filling step for forming the film 110 of the first material may be performed at a first temperature lower than a melting point of the first material. In some embodiments, the first temperature may be 100° C. or less. For example, the first material may be formed using a chemical vapor deposition (CVD) or atomic layer deposition (ALD) process. In some embodiments, plasma may be applied during the CVD or ALD process.

For example, when forming the film 110 of the first material including PSG, the filling step may include supplying a silicon source and supplying a phosphorus source. Selectively, the filling step may further include supplying an RF power. In an alternative embodiment, purging the silicon source and purging the phosphorus source may further be included.

The supplying and purging of sources described above may be repeated a plurality of times as a cycle. For example, the supplying and purging of a silicon source may be repeated a plurality of times as a first cycle. In addition, the supplying and purging of a phosphorus source may be repeated a plurality of times as a second cycle. The supplying of RF power may be performed in at least one of the first cycle and the second cycle.

In some embodiments, the silicon source may include aminosilane such as bis-diethylaminosilane BDEAS, $(SiH_2(NEt_2)_2)$ and diisoprophylaminosilane DIPAS, $SiH_3N(iPr)_2$. In another embodiment, the silicon source may include silane such as silane ($SiH_4$), disilane ($Si_2H_6$), trisilane ($Si_3H_8$), tetrasilane ($Si_4H_{10}$), or higher order silane having the formula $Si_xH_{(2x+2)}$. In another embodiment, the silicon source may include at least one of silanediamine N,N,N',N-tetraethyl ($C_8H_{22}N_2Si$), BTBAS (bis(tertbutylamino)silane), TDMAS (tris(dimethylamino)silane), hexakis(ethylamino)disilane ($Si_2(NHC_2H_5)_6$), hexachlorodisilane (HCDS), and pentachlorodisilane (PCDS).

In addition, in some embodiments, the phosphorus source may include trimethylphosphite (TMPi) $(P(OCH_3)_3)$. In another embodiment, the phosphorus source may include at least one of tris(trimethylsilyl)phosphine $[P(TMS)_3]$, tris(dimethylamino)phosphine $[P(DMA)_3]$, and tris(diethylamino)phosphine $[P(DEA)_3]$.

The film 110 of the first material including PSG thus formed is shown in FIG. 2. The first material included in the film 110 may include $Si_xP_2O_3$. In an alternative embodiment, at least a portion of $Si_xP_2O_3$ included in the first material may have a linear molecular structure. In another alternative embodiment, $Si_xP_2O_3$ included in the first material may change to have a linear molecular structure after a first flow step S620, which will be described later below.

Figure 3:
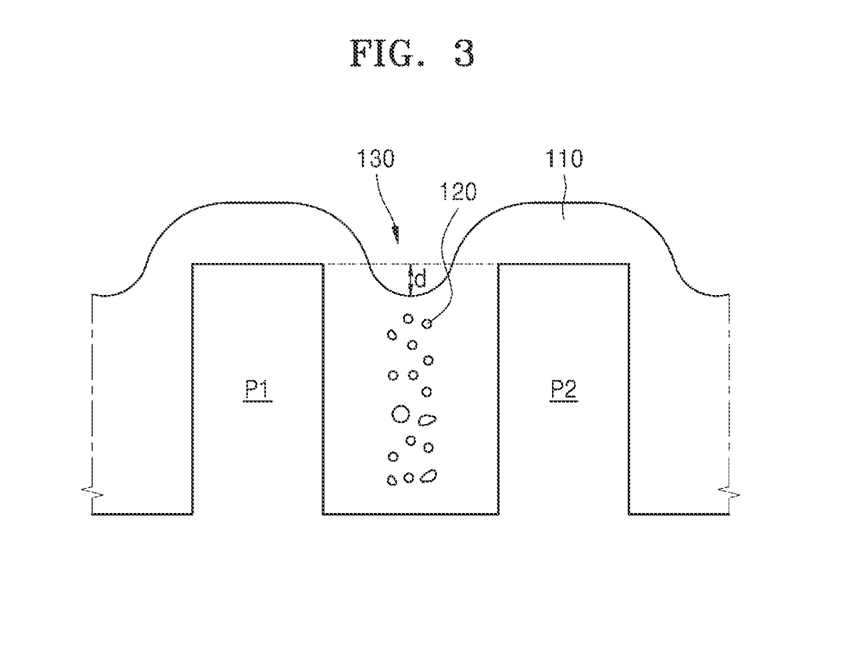

Thereafter, referring to FIGS. 3 and 6, a first flow step (S620) of imparting flowability to the film 110 of the first material is performed. For example, as active species of an inert gas element are supplied onto the film 110 and the active species collide with the film 110 of the first material, the flowability of the film 110 of the first material may be increased due to an ion bombardment effect. In some embodiments, the supplying of the active species of the inert gas element included in the flowability imparting step and subsequent purging step may be repeated a plurality of times as a third cycle.

The above-described step of imparting flowability onto the film 110 of the first material may be performed at the same temperature (i.e., the first temperature) as in the filling step. In another example, the imparting of flowability to the film 110 of the first material may be performed at a temperature different from that in the filling step (i.e., a temperature different from the first temperature).

As a specific example, an argon gas may be supplied as an inert gas into a reaction space during the flowability imparting step, and RF power may be applied to the reaction space to generate argon active species. In some examples, the RF power may be directional, so that the argon active species may be applied toward the film 110. When the argon active species collides with the PSG film 110, $C_2H_5OH$ may be generated as a by-product, which may be removed from the reaction space in a subsequent purge step.

The film 110 of the first material to which flowability is imparted may form a gap-fill layer between the first protrusion P1 and the second protrusion P2. The gap-fill layer may include a recess 130 having a first depth d from an upper surface of the first protrusion P1. In addition, the gap-fill layer may include a void 120 therein. In some embodiments, the void 120 may include the above-described inert gas element.

Thereafter, as shown in FIG. 4, a second flow step (S630) for the film 110 of the first material (in FIG. 3) is performed. In more detail, converting the first material included in the film 110 (of FIG. 3) into a second material by applying RF power may be performed. In some embodiments, during the second flow step, at least one constituent element included in the first material may be supplied to a reaction space of the plasma atmosphere. In an alternative embodiment, the purge step may be performed after the supply of the at least one constituent element. In addition, the supply and subsequent purge of the constituent element may be repeated a plurality of times as a fourth cycle.

According to some embodiments, the first material included in the film 110 (in FIG. 3) may be converted into the second material by supplying such a constituent element. In this case, in an alternative embodiment, flowability of the second material may be greater than that of the first material.

This second flow step may be performed at a second temperature lower than the melting point of the first material. For example, when the first material includes PSG, the second temperature may be 700° C. or less, which is a melting point of PSG. In an alternative embodiment, the second temperature may be selected as a level at which no thermal shock is applied to a semiconductor device. Therefore, at a temperature lower than the melting point of the first material, fluidization of the first material is induced without thermal damage to the semiconductor device, thereby increasing the density of the film 110 (in FIG. 3), removing voids, and filling the trench TR (in FIG. 1).

In some embodiments, the second temperature may be the same as the first temperature in the above-described filling step. For example, both the first temperature and the second temperature may be room temperature to 300° C. In another embodiment, the second temperature may be higher than the first temperature. For example, the first temperature may be room temperature to 300° C., and the second temperature may be 250° C. to 650° C.

Figure 12:
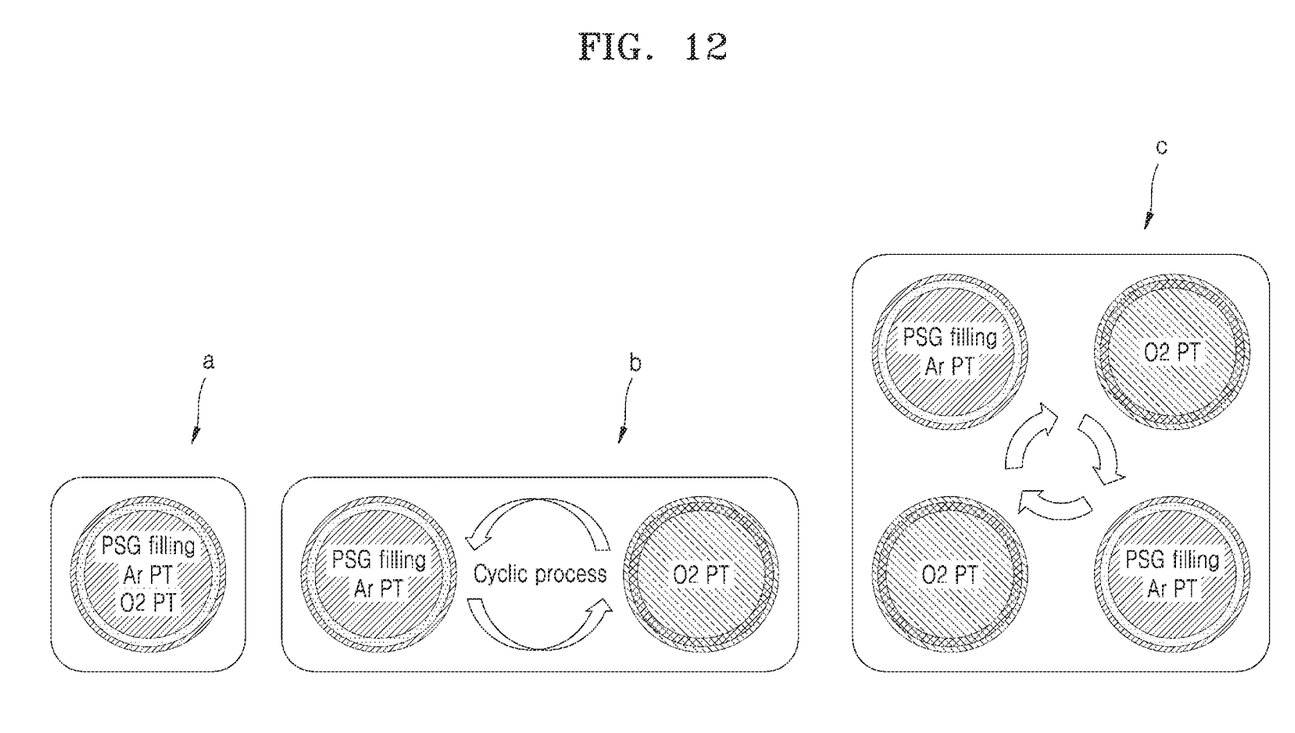
FIG. 12 is a view illustrating a substrate processing method according to an embodiment.

In some embodiments, the filling step and the second flow step may be performed in-situ in the same reactor (see FIG. 12 (a)). Such an in-situ process may be applied, for example, to an embodiment in which the first temperature and the second temperature are the same. In another embodiment, the filling step and the second flow step may be performed in different reactors.

For example, the filling step may be performed in a first reactor, and the second flow step may be performed in a second reactor (see FIG. 12 (b)). In this case, a substrate processing apparatus may include a substrate transfer unit configured to transfer a substrate from the first reactor to the second reactor.

In a further embodiment, the substrate processing apparatus may be configured to process a plurality of substrates simultaneously. In this case, the substrate processing apparatus may further include a third reactor configured to perform the filling step for an additional substrate and a fourth reactor configured to perform a flow step for the additional substrate (see FIG. 12 (c)). In addition, the substrate transfer unit of the substrate processing apparatus may be further configured to transfer a substrate from the third reactor to the fourth reactor.

In an example where the first material includes an oxygen component, supplying an oxygen-containing gas and supplying RF power may be performed during the second flow step. Because the first material includes oxygen elements as a component thereof, the oxygen content of the second material generated by the supplying of an oxygen-containing gas may be greater than the oxygen content of the first material.

In some embodiments, the first material may include PSG. In this case, the film 110 of the first material (in FIG. 3) (i.e., a PSG film) may include $Si_xP_2O_3$. Oxygen active species may be applied onto the PSG film during the second flow step, whereby $Si_xP_2O_3$, the first material included in the PSG film, may be converted into the second material, $Si_xP_2O_5$. As such, $Si_xP_2O_3$ having a linear molecular structure is converted to $Si_xP_2O_5$ having a networked molecular structure, thereby increasing the density of the PSG film and removing voids in the PSG film.

Although the technical spirit of the disclosure has been described by taking PSG as an example in this specification, it should be noted that the disclosure is not limited to these embodiments. For example, one of ordinary skill in the art will be able to derive a technical idea for converting a first material having a linear molecular structure to a second material having a networked molecular structure having a higher density and/or flowability from the present specification by supplying at least one constituent element included in the first material of a gap-fill layer and applying plasma at a temperature below a melting point of the first material.

A film 110' including the second material that has been thus subjected to the second flow step is shown in FIG. 4. The film 110' including the second material may include a recess 130' having a second depth d' from an upper surface of the first protrusion P1 (and the second protrusion P2). In some embodiments, the second depth d' may be greater than the first depth d shown in FIG. 3, which may be because the existing voids 120 (in FIG. 3) in the gap-fill layer are removed during the second flow step. In another embodiment, the second depth d' may be less than the first depth d illustrated in FIG. 3.

Referring back to FIG. 6, after the second flow step, operation S640 of determining whether the filling of the trench is completed is performed. Because the film 110' after the second flow step shown in FIG. 4 has the recess 130' of the second depth, it is determined that the filling of the trench is not completed. In this case, the forming of the film 140 (FIG. 5) of the first material may be performed again, and the recess may be filled as shown in FIG. 5.

Figure 7:
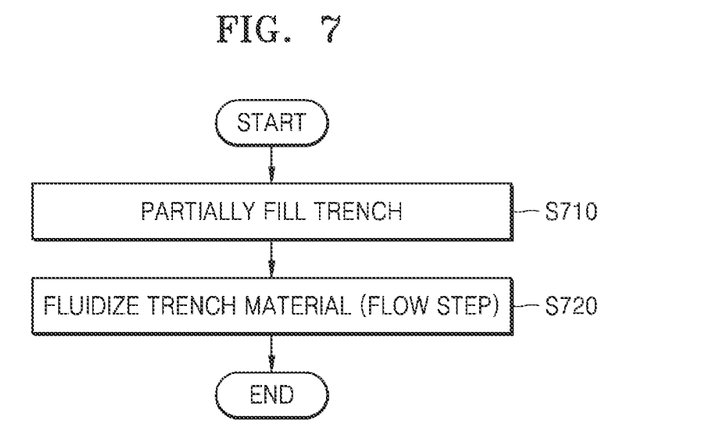
FIG. 7 is a view illustrating a substrate processing method according to embodiments.

FIG. 7 is a view illustrating a substrate processing method according to embodiments. The substrate processing method according to the embodiments may be a variation of the substrate processing method according to the above-described embodiments. Hereinafter, repeated descriptions of the embodiments will not be given herein.

Referring to FIG. 7, the substrate processing method may include operation S710 of partially filling a trench and operation S720 of fluidizing a trench material (i.e., a flow step). In the case of the above-described embodiment of FIG. 6, both the first flow step (S620 in FIG. 6) and the second flow step (S630 in FIG. 6) are performed to fluidize the trench material, and in the embodiment of FIG. 7, any one of the first flow step and the second flow step may be omitted.

For example, according to an embodiment of FIG. 7, the second flow step of FIG. 6 may be omitted and only the first flow step may be performed.

Operation S720 of fluidizing a trench material may be performed at a temperature below a melting point of the trench material as described above. An inert gas element may also be supplied to fluidize the trench material. Plasma may also be applied to allow the inert gas element to infiltrate into the trench material.

A first plasma atmosphere in operation S710 of partially filling a trench may be different from a second plasma atmosphere in operation S720 of fluidizing a trench material. For example, an RF power level of the second plasma atmosphere may be greater than an RF power level of the first plasma atmosphere. In addition, an RF power application time of the second plasma atmosphere may be greater than an RF power application time of the first plasma atmosphere. Due to this relatively large RF power and RF power application time, an ion bombardment effect and ion energy of an inert gas element may increase, which may promote fluidization of a trench material.

In addition, according to another embodiment of FIG. 7, the first flow step of FIG. 6 may be omitted and only the second flow step may be performed.

Operation S720 of fluidizing a trench material may be performed at a temperature below a melting point of the trench material as described above. At least one constituent element included in the trench material may also be supplied to fluidize the trench material. Plasma may also be applied to allow the constituent elements to infiltrate into the trench material.

The first plasma atmosphere in operation S710 of partially filling a trench may be different from the second plasma atmosphere in operation S720 of fluidizing a trench material. For example, the pressure of the second plasma atmosphere may be less than the pressure of the first plasma atmosphere. In addition, an RF frequency of the second plasma atmosphere may be less than an RF frequency of the first plasma atmosphere. Due to the relatively low process pressure and low RF frequency, a mean free path of the constituent elements may increase, which may contribute to fluidization of a trench material.

Figure 8:
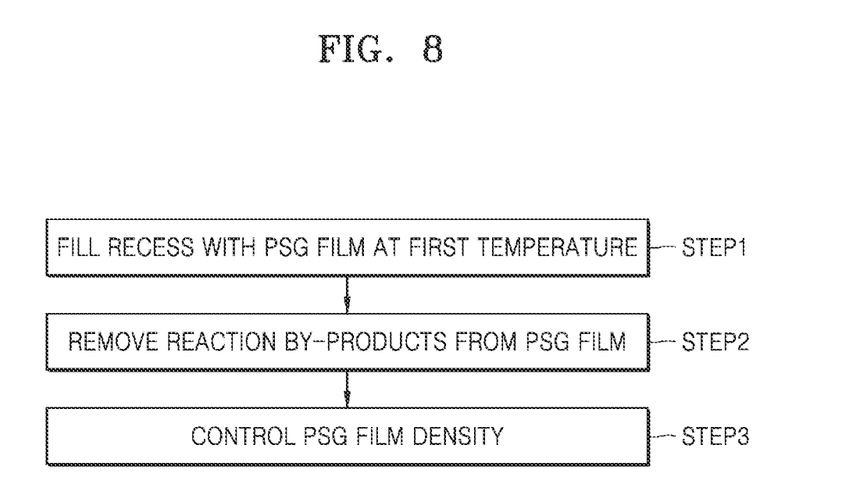
FIG. 8 is a flowchart illustrating a process sequence for filling a recess, such as a gap, according to an embodiment.

FIG. 8 is a flowchart illustrating a process sequence for filling a recess, such as a gap, according to an embodiment. A detailed description of each step is as follows.

1. First step (STEP 1): PSG film filling step. In this step, a recess, such as a gap or trench, is filled with a PSG film. This step is performed at a first treatment temperature, wherein the first treatment temperature is a temperature below a melting point (700° C.) of the PSG film. This step includes adsorbing a Si film and adsorbing a phosphorous (P) film, and films are adsorbed in each step by alternately supplying source gas and RF power.
2. Second step (STEP 2): Reaction by-product removal step. In this step, reaction by-products generated in the first step or unreacted by-products that are not desorbed after the reaction are removed. For example, non-desorbed ligands or unreacted elements of a PSG film deposited by ion energy of Ar-active species are removed through chemical reaction with Ar-active species. In addition, in this step, flowability of the PSG film increases due to an ion bombardment effect along with the removal of unreacted by-products by Ar ion energy. This step may be performed as a continuous process at the same first treatment temperature as in the first step. In another embodiment, this step may be omitted and reaction by-products may be removed in the first step.
3. Third step (STEP 3): PSG film density control step. In this step, the density of the PSG film filling a recess area is improved. In this step, a gas containing oxygen, for example, activated oxygen is supplied to the PSG film to make the PSG film reflowable to improve the density. This step is performed at a second treatment temperature lower than the melting point of the PSG film. The second treatment temperature may be the same as or different from the first treatment temperature. This step may suppress the formation of voids that may be formed in the PSG film and control etch characteristics (e.g. WERR; Wet Etch Rate Ratio) of the PSG film.

Figure 9:
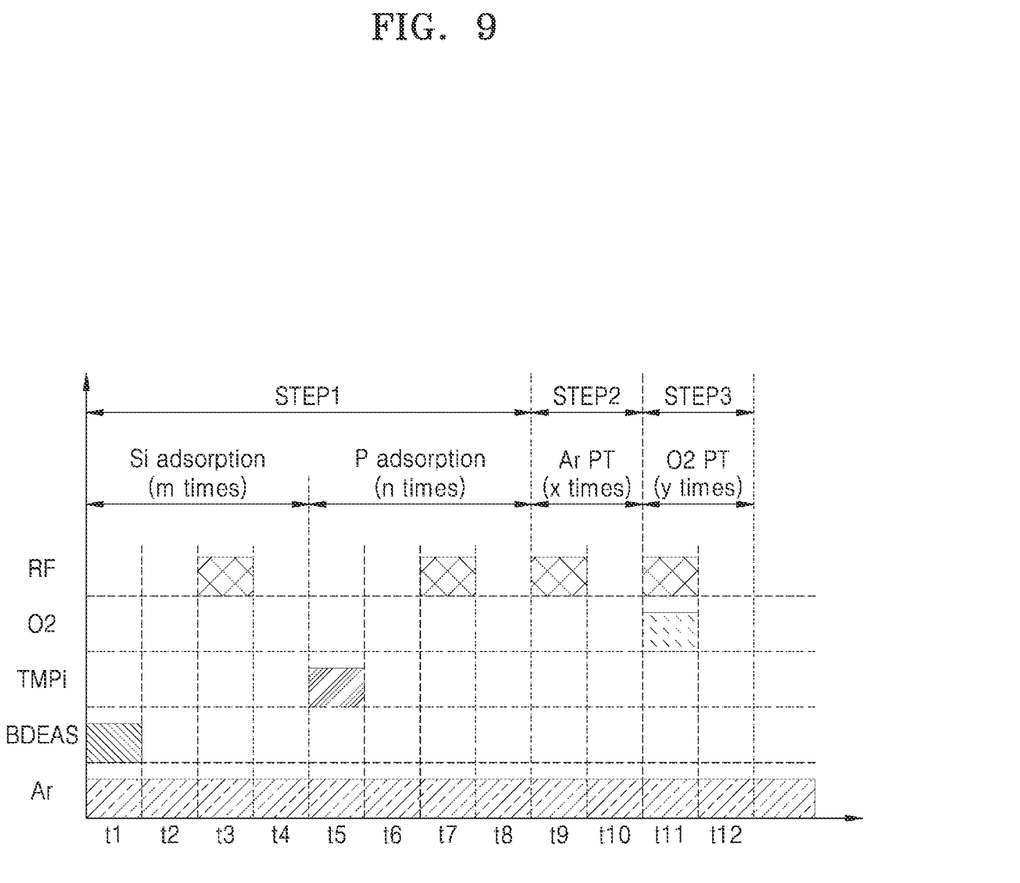
FIG. 9 is a graph illustrating a process sequence according to FIG. 8.

FIG. 9 is a graph illustrating a process sequence according to FIG. 8.

In FIG. 9, a first step (STEP 1), a second step (STEP 2), and a third step (STEP 3) correspond to the first step (STEP 1), the second step (STEP 2), and the third step (STEP 3) of FIG. 8, respectively. A detailed description of each step of FIG. 9 is as follows.

1. First step (STEP 1): PSG film filling step. This step is a step of filling a recess, such as a gap or a trench, with a PSG film, and corresponds to steps t1 to t8 (sub-steps) of FIG. 9. In this step, while continuously supplying an Ar gas, a Si source (precursor), a P source, and RF power are alternately supplied. BDEAS (SiH$_2$(NEt$_2$)$_2$) is used as the Si source, and TMPi (P(OCH$_3$)$_3$), which is a liquid source, is used as the P source.

In steps t1 to t4 of FIG. 9, BDEAS source molecules are chemisorbed on the surface. Then, a BDEAS source adsorbed by an ion bombardment effect of Ar activated by RF power or ion energy is decomposed. The decomposed BDEAS source may include individual Si elements, carbon elements and hydrogen elements, or partial combinations thereof, and decomposition products other than the Si elements are exhausted in a purge step.

In steps t5 to t8 of FIG. 9, the TMPi source is supplied and then decomposed by the ion bombardment effect or ion energy of Ar activated with RF power. Phosphorus element and oxygen element, which are components of the TMPi source, react with a Si layer to form a PSG film having a Si$_x$P$_2$O$_3$ structure.

These steps t1 to t8 may be performed at a first treatment temperature lower than a melting point of the PSG film. In another embodiment, the first treatment temperature may be 100° C. or less.

2. Second step (STEP 2): Reaction by-product removal step. This step is a step in which a flowability of the PSG (Si$_x$P$_2$O$_3$) film formed below the melting point by activated Ar ions is increased, and corresponds to steps t9 and t10 (sub-steps) of FIG. 9. The PSG film formed below the melting point has increased flowability. In addition, STEP 2 is a step capable of removing unreacted materials that are not desorbed from by-products of TMPi and BDEAS generated in STEP 1. Accordingly, a recess area is filled in a flowable manner. In order to increase the ion bombardment effect and ion energy, the density of Ar active species may be increased or a retention time of an active state may be increased. For example, the intensity of RF power supplied in this step may be greater than that in the first step (STEP 1). Alternatively, an RF power supply time may be longer. This step (t9 to t10) is performed at a temperature lower than the melting point of the PSG film. For example, this step may be performed at the same first treatment temperature as in the first step STEP 1. In another embodiment, this step may be omitted and reaction by-products may be removed in the first step (STEP 1).

3. Third step (STEP 3): PSG film density control step. This step is a step of controlling the density of the PSG film of a Si$_x$P$_2$O$_3$ structure, and corresponds to steps t11 to t12 (sub-steps) of FIG. 9. In this step, a structure of the PSG film is converted from Si$_x$P$_2$O$_3$ to Si$_x$P$_2$O$_5$ by activating oxygen (O$_2$) with RF power to supply oxygen to the film. In other words, by additionally supplying oxygen ions into the film to induce reflow of the PSG film, a molecular structure of the film is converted from a linear molecular structure to a more complex networked molecular structure. Therefore, the density of the PSG film is improved and formation of voids in the PSG film is suppressed.

In this step, Ar plasma treatment and oxygen plasma treatment are performed simultaneously. Accordingly, the PSG filling step may be performed only by omitting the second step (STEP 2) and only by the first step (STEP 1) and the third step (STEP 3). In this step, in order to increase the ion bombardment effect and ion energy, the density of the Ar active species may be increased or the retention time of the active state may be increased. For example, the intensity of RF power supplied in this step may be greater than that in the first step (STEP 1). Alternatively, an RF power supply time may be longer.

In addition, this step may be performed under a low process pressure and RF power of a low frequency so that a mean free path of oxygen ions is longer in order for the oxygen ions to infiltrate into the PSG film.

This step may be performed at a second treatment temperature lower than the melting point of the PSG film. In another embodiment, the second treatment temperature may be the same as the first treatment temperature. In another embodiment, the second treatment temperature may be higher than the first treatment temperature and lower than the melting point.

Figure 10:
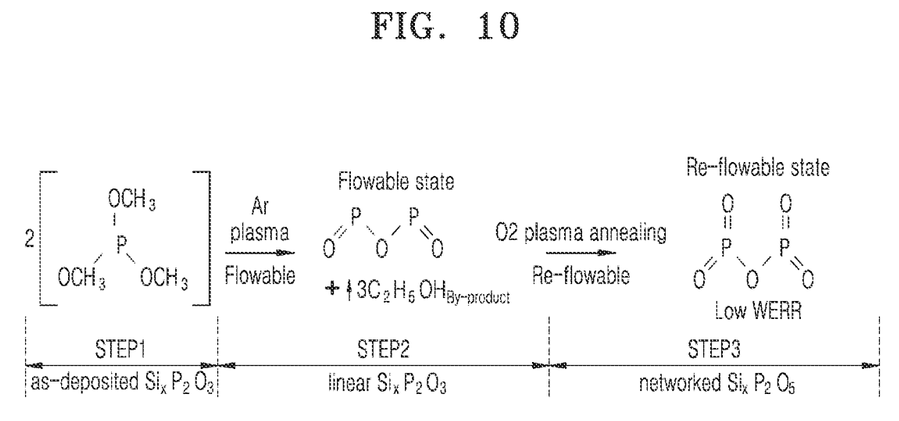
FIG. 10 is a view illustrating changes in a molecular structure of a film in a first flowability imparting step and a second flowability imparting step.

FIG. 10 is a view illustrating changes in a molecular structure of a film in a first flowability imparting step and a second flowability imparting step. First, a first step (STEP 1) refers to depositing a PSG film in a recess area, and corresponds to the first steps (STEP 1) of FIGS. 8 and 9. It should be noted that, for the sake of understanding, a Si element is omitted and only a TMPi source molecule, which is a P source, is shown. The first step (STEP 1) shows TMPi source molecules as-deposited on a recess surface.

The second step (STEP 2) of FIG. 10 corresponds to the second steps (STEP 2) of FIGS. 8 and 9. In the second step (STEP 2), a molecular structure of the PSG film is changed to a linear molecular structure by ion bombardment of activated Ar ions, and the flowability is increased. Accordingly, in the second step (STEP 2), the flowability of the PSG film is increased to flow and fill the recess area.

In the third step (STEP 3) of FIG. 10, the molecular structure of the PSG film is converted from a linear $Si_xP_2O_3$ structure to a networked $Si_xP_2O_5$ structure by supplying activated oxygen ions to increase an oxygen content in the PSG film. Due to the inclusion of more oxygen ions, the PSG film is reflowed and converted into a networked molecular structure, and the density of the film increases. Formation of voids in the PSG film is suppressed due to a denser structure. A WERR (Wet Etch Rate Ratio) of the PSG film decreases compared to a WERR in the second step (STEP 2) due to an increase in the density of a film. Accordingly, the PSG film filling the recess area is stabilized and solidified.

Table 1 below is comparison data of the WERR of the PSG film compared to a thermal oxide film (thermal $SiO_2$). The WERR represents a ratio of an etching rate of the PSG film to an etching rate of the thermal oxide film (thermal $SiO_2$) in a diluted HF (DHF) etching solution diluted to 500:1.

TABLE 1

| Status | WERR |
| --- | --- |
| After STEP 2 ($Si_xP_2O_3$) | >300 (fully etched) |
| After STEP 3 ($Si_xP_2O_5$) | 5 |

As shown in Table 1, WERR before oxygen plasma treatment (after STEP 2) is 300 or more, which is much higher than WERR after oxygen plasma treatment (after STEP 3). This shows that the density of the PSG film is increased and the etching resistance is improved by the oxygen plasma treatment.

Figure 11:
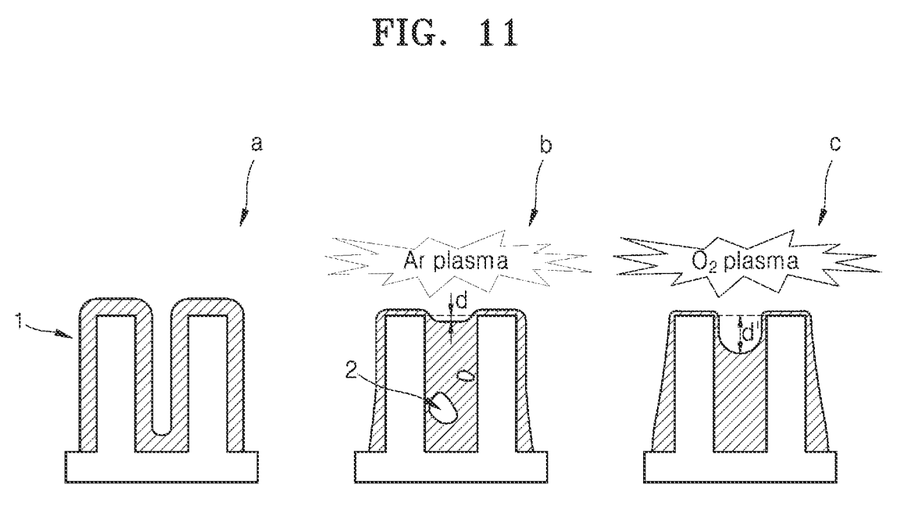
FIG. 11 is a view illustrating a filling state of a PSG film according to an embodiment.

FIG. 11 is a view illustrating a filling state of a PSG film according to an embodiment. FIG. 11 (a) shows a PSG film (first step (STEP 1)) in a deposited state, FIG. 11 (b) shows a filling state after Ar plasma treatment (second step (STEP 2)), and FIG. 11 (c) shows a filling state after oxygen plasma treatment (third step (STEP 3)).

FIG. 11 (a) shows a PSG film 1 deposited in a recess structure at a first treatment temperature lower than a melting point of the PSG film. FIG. 11 (b) shows that flowability is improved by applying Ar plasma to a PSG film, which is deposited at a temperature below the melting point of the PSG film and has decreased flowability. However, because the flowability is induced by a physical method, a void 2 exists inside the film. FIG. 11 (c) shows a PSG film having a higher density and no voids inside the film by performing oxygen plasma treatment at a second treatment temperature lower than the melting point of the PSG film to supply an additional oxygen element to the PSG film and induce reflow of the film. In FIGS. 11(b) and 11(c), the depth d of an upper portion of the film filling the recess may be increased while the flowability of the PSG film is improved (d<d'). Accordingly, the difference in depth between the upper portion of the recess and an upper portion of the PSG film may be reduced by repeating the first step (STEP 1) to the third step (STEP 3).

Table 2 below shows operating conditions of an embodiment.

TABLE 2

| Items | | Specific conditions |
| --- | --- | --- |
| Gas flow rate (sccm) | Si source (BDEAS) carrier Ar | 2,000 to 6,000 (Preferably 3,000 to 4,000) |
| | P source (TMPi) carrier Ar | 2,000 to 6,000 (Preferably 3,000 to 4,000) |
| | Purge Ar | 2,000 to 6,000 (Preferably 3,000 to 4,000) |
| | O2 | 500 to 2,000 (Preferably 800 to 1,600) |
| Process time (sec) | Si source supply | 0.2 to 1.0 (Preferably 0.3 to 0.6) |
| | P source supply | 0.2 to 1.0 (Preferably 0.3 to 0.6) |
| | Purge | 0.1 to 3.0 (Preferably 0.2 to 2.8) |
| | Ar plasma process | 1.0 to 6.0 (Preferably 2.0 to 4.0) |
| | O₂ plasma process | 1.0 to 6.0 (Preferably 2.0 to 4.0) |
| | Plasma purge | 0.01 to 3.0 (Preferably 0.2 to 2.8) |
| RF power (W) | PSG film formation step | 100 to 800 (Preferably 200 to 600) |
| | Ar plasma process step | 500 to 2,000 (Preferably 800 to 1,500) |
| | O2 plasma process step | 500 to 2,000 (Preferably 800 to 1,500) |
| RF frequency | PSG film formation step | 13.56 MHz to 60.00 MHz |
| | Ar plasma process step | 13.56 MHz to 60.00 MHz |
| | O2 plasma process step | 300 kHz to 13.56 MHz |
| Process pressure (Torr) | PSG film formation step | 6 to 10 (Preferably 7 to 9) |
| | Ar plasma process step | 6 to 10 (Preferably 7 to 9) |
| | O2 plasma process step | 0.5 to 5 (Preferably 1 to 3) |
| Temperature (° C.) | First temperature | Room temperature to 300° C. (Preferably 50 to 200) |
| | Second temperature | 250 to 650 (Preferably 300 to 550) |

FIG. 12 is a view illustrating a substrate processing method according to an embodiment. FIG. 12 (a) shows a substrate processing method in which the PSG film filling (first step (STEP 1)), Ar plasma treatment (second step (STEP 2)), and oxygen plasma treatment (third step (STEP 3)) are all performed in one reactor. In this case, a first treatment temperature is the same as a second treatment temperature. Alternatively, after a substrate is treated at the first treatment temperature, the temperature is raised to the second treatment temperature to treat the substrate at the second treatment temperature. FIG. 12 (b) shows a substrate processing method in which the first step (STEP 1) and the second step (STEP 2) are performed in one reactor, and then the third step (STEP 3) is performed by transferring the substrate to another reactor in a vacuum state (i.e., without vacuum break). FIG. 12 (c) shows a substrate processing method in which the first step (STEP 1) and the second step (STEP 2) are performed in two reactors, and then the third step (STEP 3) is performed by transferring the substrate to two other reactors in a vacuum state (i.e., without vacuum break). In the case of FIG. 12 (b) and FIG. 12 (c), PSG film filling and Ar plasma treatment may be performed in one reactor at a first treatment temperature, and then oxygen plasma treatment may be performed at a second treatment temperature different from the first treatment temperature by transferring the substrate to another reactor. When substrates are processed at different treatment temperatures, a substrate processing rate per hour may be improved by using a plurality of reactors.

As such, according to the disclosure, when filling a recess with a PSG film at a temperature lower than a melting point of the PSG film, flow of the PSG film may be improved at a first treatment temperature lower than the melting point, and by additionally supplying constituent elements of a film to the PSG film at a second treatment temperature lower than the melting point but equal to or higher than the first treatment temperature to induce reflow of the film, the density of the film may be increased and the recess filling may be performed without voids.

It is to be understood that the shape of each portion of the accompanying drawings is illustrative for a clear understanding of the disclosure. It should be noted that the portions may be modified into various shapes other than the shapes shown. In the drawings, the same reference numerals refer to the same elements.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing method comprising:
   at least partially filling a trench with a first material on a substrate including the trench; and
   supplying at least one constituent element included in the first material and applying plasma to induce fluidization of the first material, wherein
   the filling is performed at the first temperature, and the inducing of fluidization is performed at the second temperature, wherein
   at least one of the first temperature and the second temperature is lower than a melting point of the first material, and
   the second temperature is higher than the first temperature.

2. The substrate processing method of claim 1, wherein the filling is performed at a first temperature lower than a melting point of the first material.

3. The substrate processing method of claim 1, wherein the inducing of fluidization is performed at a second temperature lower than a melting point of the first material.

4. The substrate processing method of claim 1, wherein, by the fluidization, the first material is converted into a second material.

5. The substrate processing method of claim 4, wherein flowability of the second material is higher than flowability of the first material.

6. The substrate processing method of claim 4, wherein the first material has a linear molecular structure, and the second material has a networked molecular structure.

7. The substrate processing method of claim 1, wherein the filling comprises:
   supplying a silicon source;
   supplying a phosphorous source; and
   supplying RF power to at least one of the supplying of a silicon source and the supplying of a phosphorus source.

8. The substrate processing method of claim 7, wherein the silicon source comprises BDEAS, and the phosphorus source comprises TMPi.

9. The substrate processing method of claim 1, wherein the filling and the inducing of fluidization are performed in-situ in the same reactor.

10. The substrate processing method of claim 1, wherein the substrate processing method is performed in a substrate processing apparatus including at least one reactor,
    wherein the substrate processing apparatus comprises:
    a first reactor and a third reactor in which the filling is performed;
    a second reactor and a fourth reactor in which the inducing of fluidization is performed; and
    a substrate transfer unit configured to transfer a substrate from the first reactor to the second reactor and transfer a substrate from the third reactor to the fourth reactor.

11. A substrate processing method comprising:
    at least partially filling a trench with a first material on a substrate including the trench; and
    supplying at least one constituent element included in the first material and applying plasma to induce fluidization of the first material, wherein, by the fluidization, the first material is converted into a second material, wherein
    the first material comprises oxygen elements, and
    an oxygen content of the second material is greater than an oxygen content of the first material.

12. A substrate processing method comprising:
    at least partially filling a trench with a first material on a substrate including the trench; and
    supplying at least one constituent element included in the first material and applying plasma to induce fluidization of the first material, wherein supplying an inert gas is performed between the filling and the inducing of fluidization.

13. The substrate processing method of claim 12, wherein active species of the inert gas is generated during at least a portion of a time period of the supplying of an inert gas, and the active species contributes to an increase in flowability of the first material.

14. The substrate processing method of claim 12, wherein
    a gap-fill layer formed by the filling and the supplying of an inert gas comprises a recess of a first depth, and
    the gap-fill layer comprises a void.

15. The substrate processing method of claim 14, wherein, after the inducing of fluidization, the recess of the gap-fill layer is changed to have a second depth greater than the first depth.

16. The substrate processing method of claim 15, wherein the inducing of fluidization comprises:
    supplying an oxygen-containing gas; and
    supplying RF power.

17. The substrate processing method of claim 16, wherein the first material comprises $Si_xP_2O_3$, and, by the inducing of fluidization, $Si_xP_2O_3$ is converted into $Si_xP_2O_5$.

18. A substrate processing method comprising:
forming a PSG (Phosphosilicate glass) film including $Si_xP_2O_3$ at least partially filling a trench on a substrate including the trench at a first temperature below a melting point of PSG;
increasing flowability of the PSG film by applying argon active species onto the PSG film; and
inducing reflow of the PSG film by applying oxygen active species onto the PSG film at a second temperature lower than the melting point of the PSG,
wherein, by the inducing of reflow, $Si_xP_2O_3$ included in the PSG film is converted into $Si_xP_2O_5$.

19. A substrate processing method comprising:
a first cycle including supplying a silicon source including at least one of aminosilane and silane and purging the silicon source;
a second cycle including supplying a phosphorous source including at least one of trimethylphosphite (TMPi) $(P(OCH_3)_3)_m$, tris(trimethylsilyl)phosphine $[P(TMS)_3]$, tris(dimethylamino)phosphine $[P(DMA)_3]$ and tris(diethylamino)phosphine $[P(DEA)_3]$ and purging the phosphorous source;
a third cycle including supplying argon active species and purging residue including $C_2H_5OH$; and
a fourth cycle including supplying oxygen active species and purging the oxygen active species,
wherein the first cycle to the fourth cycle are performed at a temperature lower than a melting point of PSG (Phosphosilicate glass).

\* \* \* \* \*